US008837204B2

(12) United States Patent
Asa

(10) Patent No.: US 8,837,204 B2
(45) Date of Patent: Sep. 16, 2014

(54) FOUR-TRANSISTOR AND FIVE-TRANSISTOR BJT-CMOS ASYMMETRIC SRAM CELLS

(75) Inventor: Gil Asa, Zichron Yaakov (IL)

(73) Assignee: NDEP Technologies Ltd., Zichron Yakkov (IL)

( * ) Notice: Subject to any disclaimer, the term of this patent is extended or adjusted under 35 U.S.C. 154(b) by 270 days.

(21) Appl. No.: 13/201,461

(22) PCT Filed: Feb. 15, 2010

(86) PCT No.: PCT/IB2010/050668
§ 371 (c)(1),
(2), (4) Date: Aug. 14, 2011

(87) PCT Pub. No.: WO2010/092555
PCT Pub. Date: Aug. 19, 2010

(65) Prior Publication Data
US 2011/0299327 A1    Dec. 8, 2011

Related U.S. Application Data

(60) Provisional application No. 61/152,704, filed on Feb. 15, 2009.

(51) Int. Cl.
*G11C 11/00* (2006.01)

(52) U.S. Cl.
USPC .......................................................... 365/154

(58) Field of Classification Search
USPC ................................................ 365/156, 154
See application file for complete search history.

(56) References Cited

U.S. PATENT DOCUMENTS

| | | | | |
|---|---|---|---|---|
| 5,289,409 | A | * | 2/1994 | Reinschmidt .................. 365/154 |
| 5,453,636 | A | * | 9/1995 | Eitan et al. ...................... 257/378 |
| 7,745,882 | B2 | * | 6/2010 | Kim ................................ 257/370 |
| 2002/0018513 | A1 | | 2/2002 | Curry et al. |
| 2006/0275962 | A1 | | 12/2006 | Lee |
| 2006/0285374 | A1 | | 12/2006 | Szeto et al. |

OTHER PUBLICATIONS

International Search Report of the International Searching Authority for PCT Application No. PCT/IB2010/050668, dated Nov. 8, 2010.
Written opinion of the International Searching Authority for PCT Application No. PCT/IB2010/050668, dated Nov. 8, 2010.

* cited by examiner

*Primary Examiner* — Anthan Tran
(74) *Attorney, Agent, or Firm* — Pearl Cohen Zedek Latzer Baratz LLP

(57) ABSTRACT

A memory cell comprises asymmetric retention elements formed of bipolar junction transistors integrated with a CMOS transistor. The BJT transistors of the retention element may be vertically stacked. In one embodiment, the N region of two adjacent NPN BJT transistors may be connected to ground and may form a common emitter of the NPN BJT transistors while the P region of two adjacent PNP BJT transistors may be connected to high voltage and may form a common emitter of the PNP BJT transistors. For further compactness in one embodiment a base of one transistor doubles as a collector of another transistor. The retention element may have only a single bit line and a single write line, with no negative bit line. In some embodiments, a single inverter and only three transistors may form the retention element. Memory space may be cut approximately in half.

17 Claims, 8 Drawing Sheets

201 – low doping p-type substrate (part of standard CMOS)
202 – N-well (part of standard CMOS)
203 – P-well (part of standard CMOS)
204 – new p-type layer connected to V+ and forms the common emitter of the PNP
205 – new n-type layer connected to ground (common emitter for NPN)
206 – new n-type layer that forms the base (B) of the PNP
207 – new p-type layer that forms the base (B) of the NPN
208 – high doping p-type for PMOS drain/source and PNP collector (C)
209 – high doping n-type for NMOS drain/source and NPN collector (C)

Layers of Figure 2

201 – low doping p-type substrate (part of standard CMOS)
202 – N-well (part of standard CMOS)
203 – P-well (part of standard CMOS)
204 – new p-type layer connected to V+ and forms the common emitter of the PNP
205 – new n-type layer connected to ground (common emitter for NPN)
206 – new n-type layer that forms the base (B) of the PNP
207 – new p-type layer that forms the base (B) of the NPN
208 – high doping p-type for PMOS drain/source and PNP collector (C)
209 – high doping n-type for NMOS drain/source and NPN collector (C)

Fig. 2 (continued)

Compact cell (2)

US 8,837,204 B2

FOUR-TRANSISTOR AND FIVE-TRANSISTOR BJT-CMOS ASYMMETRIC SRAM CELLS

PRIORITY INFORMATION

This patent application claims the benefit of and is a continuation-in-part of U.S. Provisional Patent Application No. 61/152,704 filed Feb. 15, 2009.

FIELD AND BACKGROUND OF THE INVENTION

The present invention relates to memory sells for integrated circuits, and, more particularly to memory cells whose retention elements integrate vertically stacked bipolar transistor transistors ("BJT") with CMOS transistors.

The scale down tendency of the integrated circuit industry is causing an increasing technological barrier. One of the solutions is three-dimensional integrated circuits. These integrated circuits increase the manufacturing complexity significantly.

FIG. 1A shows an ordinary prior art six-transistor memory cell. As can be seen, it has two complementary bit lines, a bit line and a negative bit line. These two complementary bit lines are also tied to differential sense amplifier that has the ability to speed up the loaded bit lines.

Memory blocks hold 50-60% of dies area. Consequently, compacting the area of memory is equivalent to scaling down the size of the chip. The most serious effort to reduce the SRAM area (Static Random Access Memory) has been focused on the effort to reduce the number of transistors per memory cell. Such proposed solutions include the one-transistor SRAM (U.S. Pat. No. 6,765,830) and the Thyristor based SRAM (U.S. Pat. No. 6,944,051). All such proposed solutions, however, are not really SRAM, but rather are DRAM (Dynamic RAM) with SRAM interface. These memory cells require ongoing refresh cycles and significant amount of area for control and emulation of the SRAM interface. Consequently, these memory cells do not have the same applicability as an SRAM. Although these memory cells may achieve approximately 80% of area saving per cell, only less then 40% area saving will hold for full block of such memory with all the peripheral overhead.

It is noted that some of the SRAM cells designed in the past have demonstrated bipolar transistor cells or integration of such BJT (Bipolar Junction Transistors) with MOS transistors or other passive devices (U.S. Pat. No. 4,926,378 and U.S. Pat. No. 4,845,674).

There is a compelling need to have an apparatus that will significantly improve the compactness of integrated circuits, especially for SRAM. There is a further compelling need to have an apparatus that will also reduce the power requirements for such integrated circuits.

SUMMARY OF THE PRESENT INVENTION

One aspect of the present invention is directed to volatile memory, comprising a collection of memory cells, each memory cell comprising a retention element and a CMOS transistor, non-transistor semiconductor components including wires and substrate, the retention elements being asymmetric and comprising bipolar junction transistors, wherein each bipolar junction transistor is vertically stacked, the retention element operatively engaged to the CMOS transistor.

A further aspect of the present invention is directed to a memory cell for volatile memory, comprising a first pair of NPN bipolar junction transistors, wherein each NPN bipolar junction transistor in the first pair is vertically stacked; a second pair of PNP bipolar junction transistors, wherein each PNP bipolar junction transistor in the second pair is vertically stacked; and a CMOS transistor, the first and second pair of bipolar junction transistors forming a retention element operatively engaged to the CMOS transistor.

A still further aspect of the present invention is directed to a memory cell of a volatile memory, the memory cell comprising a retention element comprising four or fewer bipolar junction transistors, each bipolar junction transistor being vertically stacked, the retention element operatively enagged to an adjacent CMOS transistor.

A yet still further aspect of the present invention is directed to a retention element of a volatile memory, the retention element comprising first and second NPN bipolar junction transistors; and first and second PNP bipolar junction transistors, wherein each of the four transistors is vertically stacked, wherein a base of a first NPN transistor doubles as a collector of a first PNP transistor and wherein a base of a second NPN transistor doubles as a collector of a second PNP transistor.

A still further aspect of the present invention is directed to a retention element for a volatile memory, comprising a first transistor being a bipolar junction transistor; a second transistor being a CMOS transistor; a third transistor being either a bipolar junction transistor or a CMOS transistor, wherein the retention element is capable of functioning as a retention element without the retention element containing a fourth transistor.

A still further aspect of the present invention is directed to a RAM memory for a chip, comprising a collection of memory cells, each memory cell comprising a retention element and a CMOS transistor, the retention elements being asymmetric and comprising bipolar junction transistors, the retention element operatively engaged to the CMOS transistor, wherein a memory proportion of the chip is equal to or less than 30 percent of an area of the chip. wherein each NPN bipolar junction transistor in the first pair shares an N layer that sits on a P well of an NMOS transistor and wherein each PNP bipolar junction transistor in the second pair shares a P layer that sits on an N well of a PMOS transistor.

These and other features, aspects and advantages of the present invention will become better understood with reference to the following drawings, descriptions and claims.

BRIEF DESCRIPTION OF THE DRAWINGS

Various embodiments are herein described, by way of example only, with reference to the accompanying drawings, wherein:

FIG. 2A shows a top plan view of the transistors of the memory cell of FIG. 2;

FIG. 2B shows an isometric view of a transistor of the memory cell of FIG. 2;

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention generally provides a memory cell for RAM memory and for other volatile memory such as a flip-flop and a register file. The cell may comprise a retention element and either an adjacent NMOS or adjacent PMOS transistor operatively engaged to the retention element. The retention element may be assymetric and may be comprised of four bipolar junction transistors, each of which may be vertically stacked. Other than the retention elements the chip may use CMOS transistors. The NPN bipolar junction transistors may share an N layer and the PNP bipolar junction transistor may share a P layer. For further compactness, in one embodiment a base of one BJT transistor may double as a collector of another BJT transistor. The retention element may have only a single bit line and a single write line, with no negative bit line. In some embodiments, a single inverter and only three transistors, including one or two BIT transistors, may form the retention element.

Figure 1:
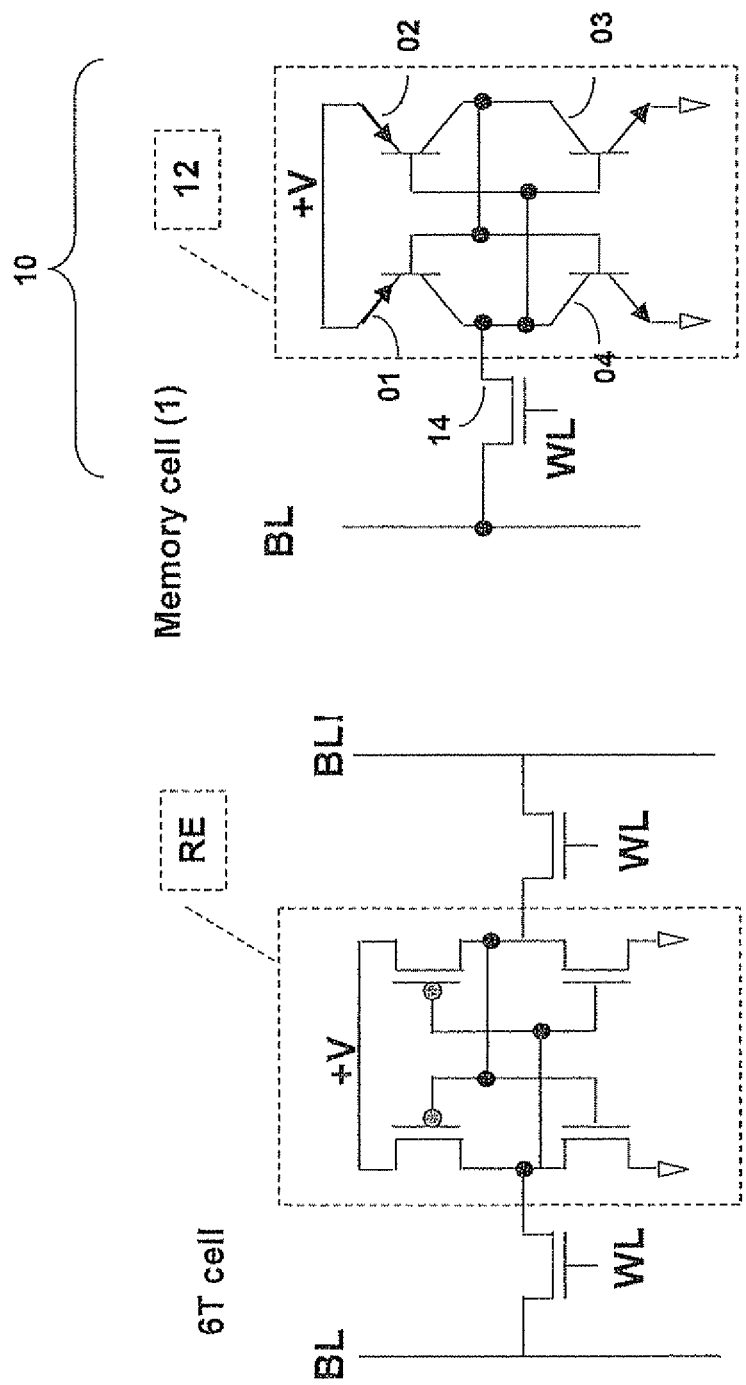
FIG. 1A is a schematic of a six transistor memory cell of the prior art using CMOS technology.
FIG. 1B is a schematic of a compact memory cell using four bipolar junction transistors and having one write line and one bit line.

In contrast to the prior art, in which memory cells may either use CMOS transistors or bipolar junction transistors (BJT), the memory cell of the present invention may involve integrating a BJT retention element into a chip that may otherwise be filled with CMOS transistors. In further contrast to the prior art, in which SRAM cells may have 6 transistors, the memory cells of the present invention may have only 4 or 5 transistors. In further contrast to the prior art, in which BJT technology is power hungry, the BJT retention element of the present invention may draw a very reasonable amount of current and power (e.g. 10% of the widely used 6 transistor cell in terms of power). This may be for three reasons. First, because in contrast to the prior art, in which BJT retention elements may typically have a high current gain on the order of magnitude of 100, the retention element of the present invention may suffice with a current gain on the order of magnitude of one or two. Second, because in contrast to prior art BJTs that are relatively large, BJTs of the present invention may be much smaller since the BJTs of the present invention must meet the critical dimensions of CMOS environment in which they are embedded, which is 100 times as small as BJT critical dimensions. Third, because in contrast to the prior art, in which the voltage on the base-emitter junction may be approximately 1.0 volts since BJTs are typically not used for memory but for amplifiers which may require higher voltage, the base-emitter junction of the BJT retention element of the present invention may have a relatively small forward voltage of only approximately 0.7 volts or less, and preferably 0.6 volts. In still further contrast to the prior art, in which transistors of retention elements in a CMOS environment may be laid out horizontally, the transistors of the retention element of the present invention may be vertically stacked, which may make it more compact. In further contrast to the prior art, two NPN or PNP transistors may share a common emitter. In still further contrast to the prior art, the SRAM cells of the present invention may be able to save 50% of the area relative to the six transistor cell SRAM block (see, e.g. FIG. 1A) with the same operating speed. This may reduce the cost of making the chip in two ways: first because cost is directly proportional to the area of the chip and second because reducing the area of the chip may increase the yield (i.e. the proportion of chips that can be considered "good chips") which independently reduces the cost of manufacturing the chip. In still further contrast to prior art, in which additional materials involved adding additional items of critical dimension, the added materials in the chip pursant to the present invention may include nothing of critical dimensions. In further contrast to the prior art, in which retention elements of memory are symmetrical, requiring matching transistors, something that is harder and harder to achieve due to miniaturization, the retention elements of the present invention may be asymmetric. In yet still further contrast to the prior art, in which the base of one transistor in the retention element is independent of the collector of the second transistor in the retention element, in at least one embodiment of the retention element of the present invention (see, e.g. FIG. 3), the base of one transistor may also double as the collector of a second transistor. This may further add to the compactness of the cell. In still further contrast of the prior art, in which two inverters are used in a retention element, the retention element of the present invention, in at least two embodiments (see, e.g. FIG. 4A and FIG. 5), may have a single inverter.

The term "vertically stacked" means the three regions of the bipolar junction transistor are stacked vertically. The term "area" in the context of a chip or in the context of the memory portion of a chip refers to two-dimensional area of a chip and the two dimensions refer to length and width on a surface and do not include the depth of the chip.

When a phrase refers to "a third transistor being either a bipolar junction transistor or a CMOS transistor" the word "either" in that phrase intends to exclude a possibility of the third transistor sometimes being a BJT transistor and sometimes being a CMOS transistor.

The principles and operation of the memory cell and retention element of the present invention may be better understood with reference to the drawings and the accompanying description.

FIG. 1B shows a cell that is more compact that the prior art cell shown in FIG. 1A and has only one WL (write line) and one bit line. It uses Bipolar Junction Transistors (BJT). BJT transistors 01 and 04 four an inverter. BJT transistors 02 and 03 form a second inverter. The cell 1 is formed by two cross-coupled bipolar inverters.

Figure 2:
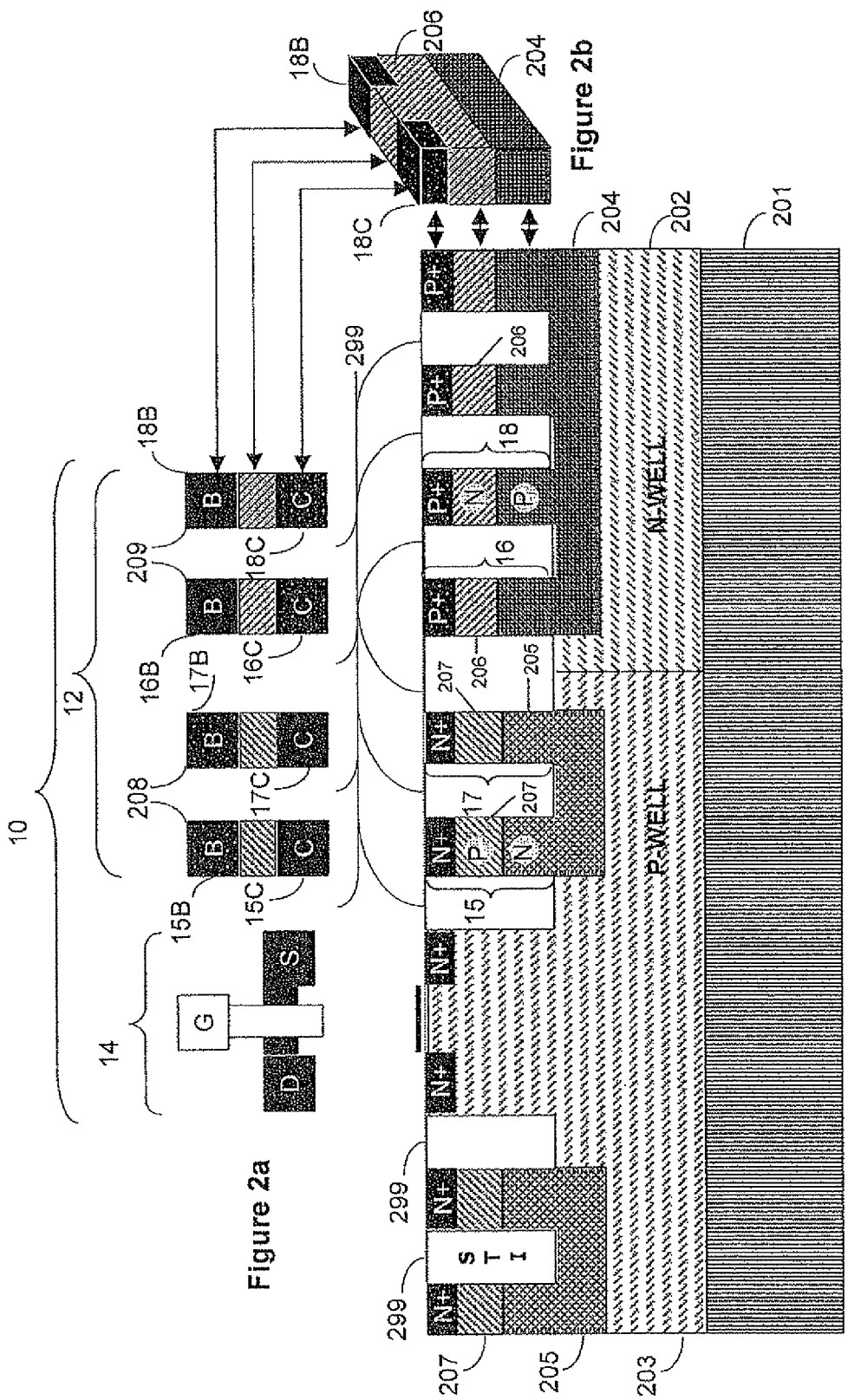
FIG. 2 shows a vertical cross-sectional view of a memory cell having a bipolar junction transistor retention element integrated into a CMOS environment, in accordance with one embodiment of the present invention.

FIG. 2 is a cross-sectional view of a memory cell 10 which may be formed of an asymmetric retention element 12 and a CMOS transistor 14. A collection of memory cells 10 may form a RAM for a chip or may form other volatile memory. Retention element 12 may be comprised of four bipolar junction transistors 15, 16, 17, 18 integrated into and operatively engaged to a CMOS environment such as NMOS transistor 14. Besides the CMOS transistor located outside the retention element 12, the volatile memory may include non-transistor semiconductor components such as wires and substrate.

As seen from FIG. 2, retention element 12 may include a first pair of NPN bipolar junction transistors 15, 17, wherein each NPN bipolar junction transistor in the first pair may be vertically stacked in terms of its three regions. In addition, retention element 12 may include a second pair of PNP bipolar junction transistors 16, 18, wherein each PNP bipolar junction transistor in the second pair may likewise be vertically stacked. Each NPN transistor 15, 17 and each PNP transistor 16, 18 may occupy an area smaller than an area occupied by a single smallest NMOS in the volatile memory.

The schematic memory cell structure shown in FIG. 1B may be used to create the retention element 12 shown in FIG. 2. The layers of the memory cell 10 shown in FIG. 2 have been labeled. For example, low doping p-type substrate 201 is part of a standard CMOS. Other standard parts of CMOS environment may include N-well 202 and P-well 203. FIG. 2A shows a high doping p-type region/layer 208 for PMOS drain/source, PNP collectors 16C, 18C and NPN base contacts 15B, 17B. The high-doping n-type region/layer 209 serves for NMOS drain/source, NPN collectors 15C, 17C and PNP base contacts 16B, 18B, all shown in FIG. 2. In FIG. 2, the real base lies beneath the collector and above the emitter and the term "base contact" means that 15B, 17B, 16B, 18B denote the contact to the real base layer 206 for PNP and to real base layer 207 for NPN.

A RAM or other volatile memory of a chip may be formed of a collection of memory cells where each memory cell may be comprised of a retention element in accordance with one embodiment of the present invention, together with adjacent CMOS transistors, such as a NMOS or PMOS transistor.

As seen from FIG. 2, retention element 12 may be located adjacent a CMOS transistor which may be an NMOS transistor 14 such as is shown in FIG. 2 and which may alternatively be a PMOS transistor in other versions. Accordingly, as further seen from FIG. 2, each NPN bipolar junction transistor in the first pair may share a common emitter, such as an N layer 205 that sits on a P well 203 of an NMOS transistor of the CMOS environment. The common emitter may be at the lowest of the three regions of the NPN bipolar junction transistor. Likewise, each PNP bipolar junction transistor in the second pair may share a common emitter, such as a P layer 204 that sits on an N well 202 of a PMOS transistor. Again, the common emitter may be at the lowest of the region of the PNP bipolar junction transistor.

Accordingly, in this embodiment, four new layers 204, 205, 206, 207 may be implanted into the CMOS environment, two new vertical layers 204 and 206 for the PNP transistors and two new vertical layers 205 and 207 for the NPN transistors. New p-type layer 204 may be connected to high voltage V+ and may form the common emitter of the PNP transistors 16, 18. New n-type layer 206 may form the base (B) of the PNP transistors 16, 18. New n-type layer 205 may be connected to ground and form the common emitter for NPN transistors 15, 17. New p-type layer 207 may form the base (B) of the NPN transistors 15, 17. The term "new" when used in calculating "new" layers means something above and beyond the implants required in the standard CMOS manufacturing process. It is assumed that any CMOS retention element, or even a BJT retention element laid out horizontally, would occupy one top surface layer of the memory area of the chip. Accordingly, the top layers are not deemed new.

As seen in FIG. 2, the entire power supply of the retention element 12 may be conducted in buried layers 204, 205 and may not require additional metal resources (which also may take up some area). The BJT transistors may be completely encapsulated by surrounding shallow trench insulator ("STI") 299. The added layers may be simply engraved into the existing silicon N wells or P wells of the existing CMOS environment sitting on the substrate. The added implants/layers need no extraordinary critical dimensions or special skills over those needed in the standard CMOS process. Items of critical dimension may not need to be added in order to make the retention elements of the present invention. Although adding even four additional layers may increase the cost of making the chip by approximately 8%, a cost savings that may be of a higher order of magnitude may be achieved from the compactness and increased yield of the retention element. Furthermore, in some embodiments (see, e.g. FIG. 3) the number of additional layers can be cut in half.

FIG. 2B is a top perspective view further depicting the positions of the regions of one of the BJT transistors in retention element 12 of FIG. 2.

Figure 3:
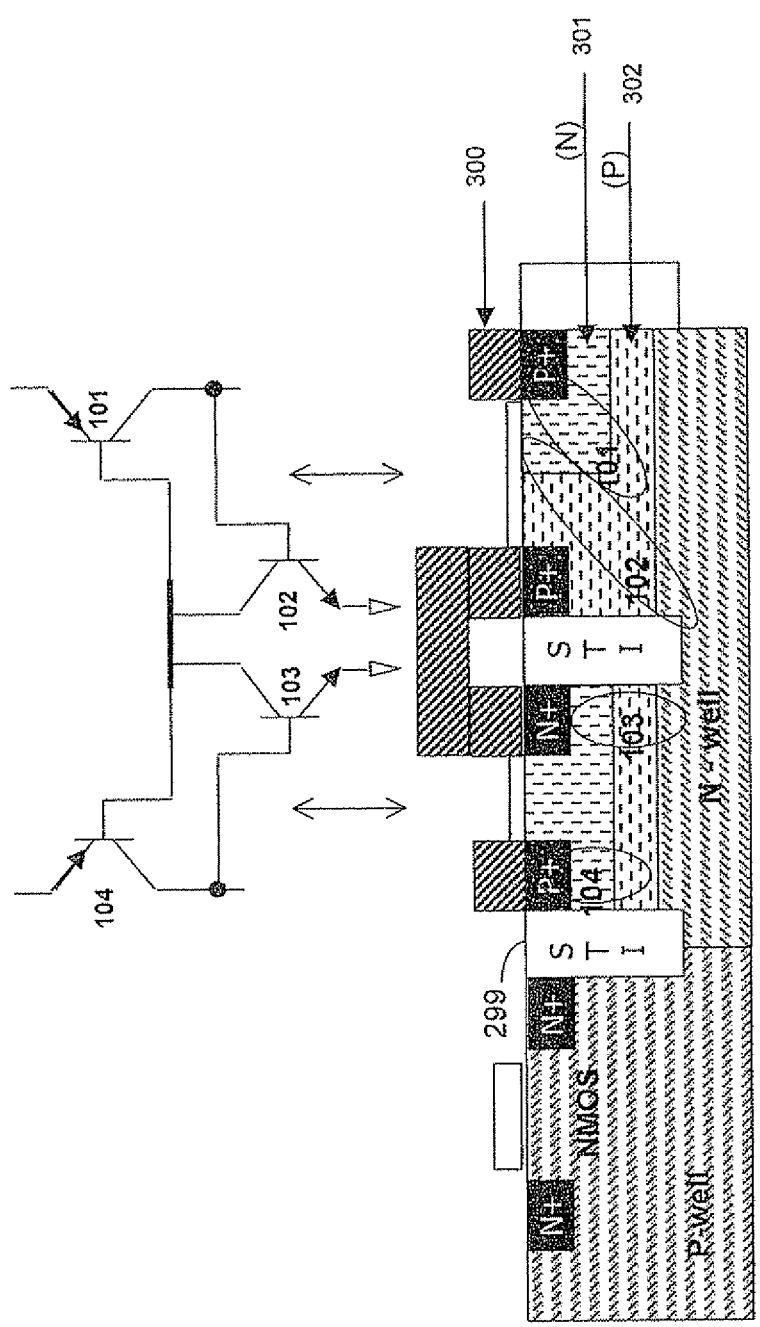
FIG. 3 shows a vertical cross-sectional view of a memory cell having a bipolar junction transistor retention element that is especially compact, in accordance with one embodiment of the present invention and also shows two schematic parts of the retention element.

FIG. 3 shows an embodiment of a memory cell 2 that may be integrated into the CMOS technology of volatile memory and that may be even more compact that the memory cell 10 of FIG. 2 since memory cell 2 may use a retention element 31 that may be even more compact than retention element 12 of FIG. 2. As seen from the elliptical circles drawn in FIG. 3, a base of one vertically stacked bipolar junction transistor may double as a collector of an adjacent vertically stacked bipolar junction transistor. For example, a base (region 302) of an NPN transistor (101) in the first pair of NPN bipolar junction transistors may double as a collector of a PNP transistor (102) in the second pair of PNP bipolar junction transistors. Likewise, a base of a PNP transistor (103) in the second pair of PNP bipolar junction transistors may double as a collector of an NPN transistor (104) in the first pair of NPN bipolar junction transistors. Accordingly, cell 2 may require only two additional implants (i.e. regions or layers) 301, 302 in addition to the implants in the standard CMOS manufacturing process. The implants may require no extraordinary critical dimensions or special skills over those needed in the standard CMOS manufacturing process. The retention element of FIG. 3, as in FIG. 2 may be asymmetrical and may have no negative bit line and one bit line.

Figure 3A:
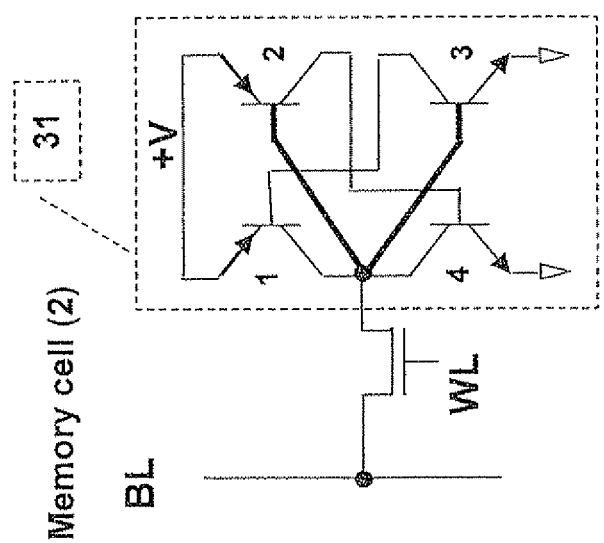
FIG. 3A is a schematic of the memory cell of FIG. 3 and showing how to connect the two schematic parts of FIG. 3.

The structure of cell 2 may also be viewed as two back-to-back thyristors. As seen in FIG. 3, the PNPN (thyristor) may be formed vertically, which may make it possible to obtain the memory cell 2 of FIG. 3A in high density. Conceptually, the structure shown in FIG. 3 may also be thought of as four transistors folded together.

In general, the BJT transistors of the retention elements of the present invention may not be hungry for a large amount of power or current. In the bipolar junction transistors of the retention elements of the present invention, the current gain on the transistors may be low, for example 1 or 2 (e.g. less than 3). It may be that the BJT transistors may be used as switches rather than as amplifiers or drivers. In addition, the transistors are very small, much smaller than usual BJT transistors since they are in a CMOS environment and the critical dimensions of CMOS transistors are approximately one hundred times smaller than the critical dimensions of BJT technology (the same being true of the dimensions of the transistors shown in FIGS. 4, 5 relative to usual BJT transistor dimensions). The BJT transistors in the retention elements of the present invention may be only slightly wider than the width of the gate of the NMOS into which the retention element is integrated. In addition, a relatively small forward bias or forward voltage may be maintained on the base-emitter junction. The cell 2 may work on low-level power supply to preserve low power and to prevent latch up. For example, forward voltage may be maintained at approximately 0.7 volts or less, and preferably approximately 0.6 volts. As can be seen for example in FIG. 4A, the voltage may be controlled by the power supply. The retention cell 2 shown in FIG. 3 using the vertical PNP/NPN structure may result in better immunity to soft errors since most of the radiation-generated carriers must cross two back-to-back PN junctions before they could penetrate the transistor base, which is on top (and radiation tends to hit below). In some embodiments, the additional implants 301, 302 may be placed under the CMOS transistors to avoid bulk noise and soft error upset.

Figure 4:
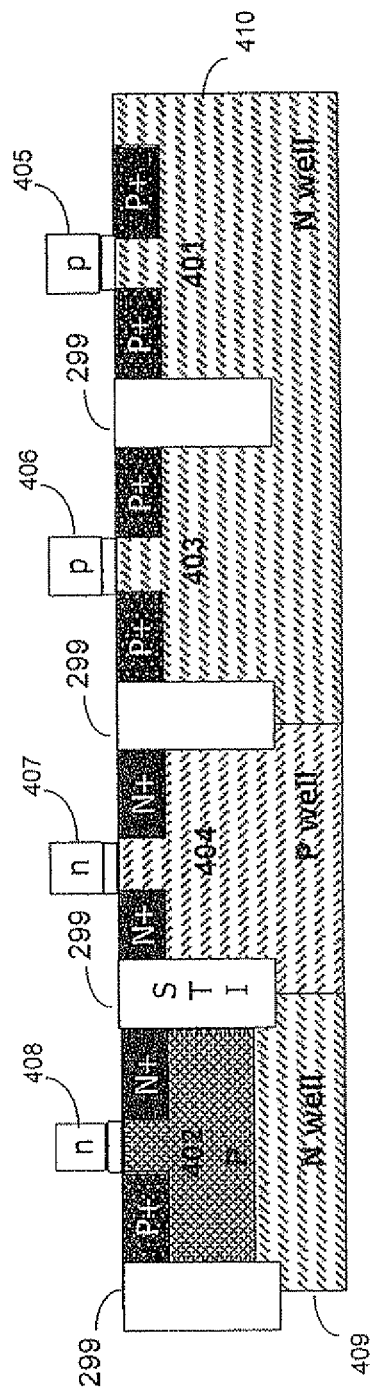
FIG. 4 shows a vertical cross-sectional view of a memory cell whose retention element may be formed of only three transistors integrated into a CMOS environment, in accordance with one embodiment of the present invention.
Figure 4A:
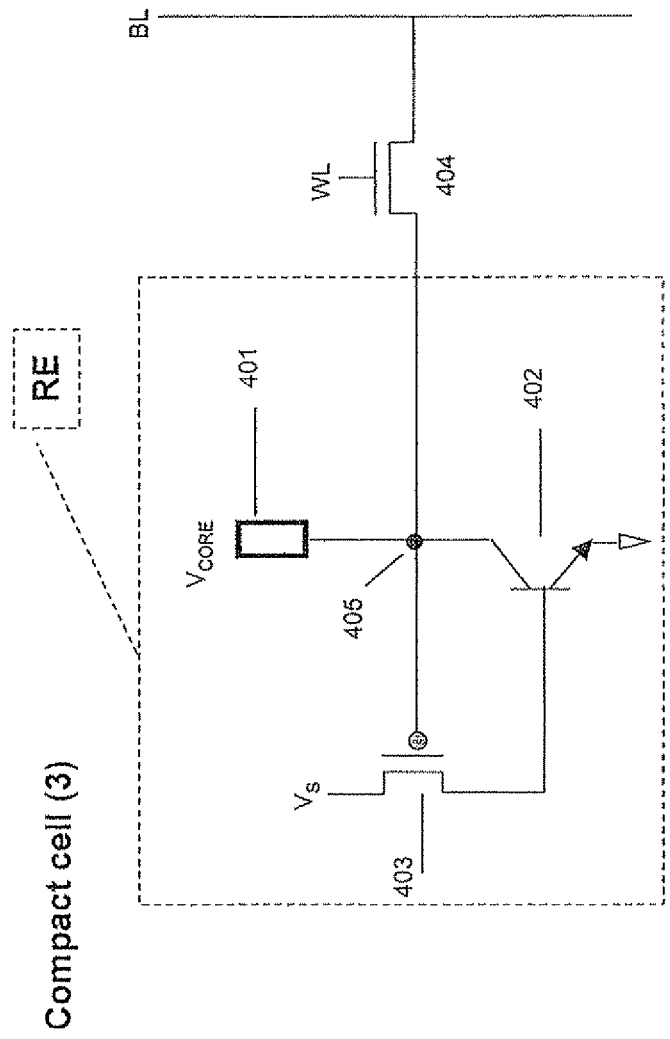
FIG. 4A is a schematic of the memory cell of FIG. 4.

FIG. 4 and FIG. 4A show an embodiment in which a retention element for a RAM memory of a chip may save area of the chip by virtue of the fact that the retention element may be comprise only three transistors. The embodiments of FIG. 4, FIG. 4A and FIG. 5 together teach a retention element for a volatile memory, comprising a first transistor being a bipolar junction transistor; a second transistor being a CMOS transistor; and a third transistor being either a bipolar junction transistor or a CMOS transistor, wherein the retention element may be capable of functioning as a retention element without the retention element containing a fourth transistor.

In the retention element of the memory cell 3 shown in FIGS. 4-4A, the first transistor 402 may be an NPN transistor, the second transistor 403 may be a PMOS transistor and the third transistor 401 may be either a PMOS transistor or a PNP transistor. The "0" data bit may be preserved using a loop. In the retention element of the memory cell 3A shown in FIG. 5, in contrast, the first transistor 502 may be a PNP transistor, the second transistor 503 may be an NMOS transistor and the third transistor 501 may be either a NMOS transistor or an NPN transistor. In the cell 3A shown in FIG. 5, "1" data bit may be preserved using a loop. In both FIGS. 4-4A and FIG. 5, the retention element contains only one inverter comprised of the first transistor and the third transistor.

In the embodiment of FIG. 4 and FIG. 4A a resistor (in place of transistor 401) may connect the high power supply to the intermediate node 405. As can be appreciated from FIG. 4, the retention element of FIG. 4A (and of FIG. 5) may be integrated into a CMOS environment of a memory chip. FIG. 4 shows a cross sectional view of the cell 3 of FIG. 4A. Since cell 3 may utilize only one NPN transistor it may require only one additional implant. Moreover, even this single implant can in certain embodiments be made part of the CMOS environment by applying the shallow P well on the deep N well to form the vertical NPN transistor (402). Note that transistor 401 is only a pull up element and can readily take the form of a lateral PNP transistor since gate 405 can become a dummy gate (the same is true for 406). Gates 407 and 406 may form part of CMOS transistors. Note also that the N well of 401 and 403 may be connected to core voltage since the other N well (under 402) may be grounded. Therefore these N wells 401, 403 should be separated with care.

The cell 3 of FIG. 4A may have only 4 transistors. Writing '1' may cause node 405 to rise to core voltage which is higher then Vs. As a result, transistor 403 may enter a state of deep cut off, and NPN transistor 402 (with no base current) may also enter a state of cut off. In this case, the voltage in node 405 may remain core voltage because it may have a high impedance path to the core supply (401). This high impedance can take the form of large resistor or PNP/PMOS transistor with appropriate base/gate bias. The pass transistor 404 can be NMOS or PMOS. Writing '0' may force zero voltage at node 405 which may turn on PMOS 403 and then NPN transistor 402 may conduct and maintain node 405 at logical '0'. In this case, a small DC current may run through the large impedance of transistor 401.

Figure 5:
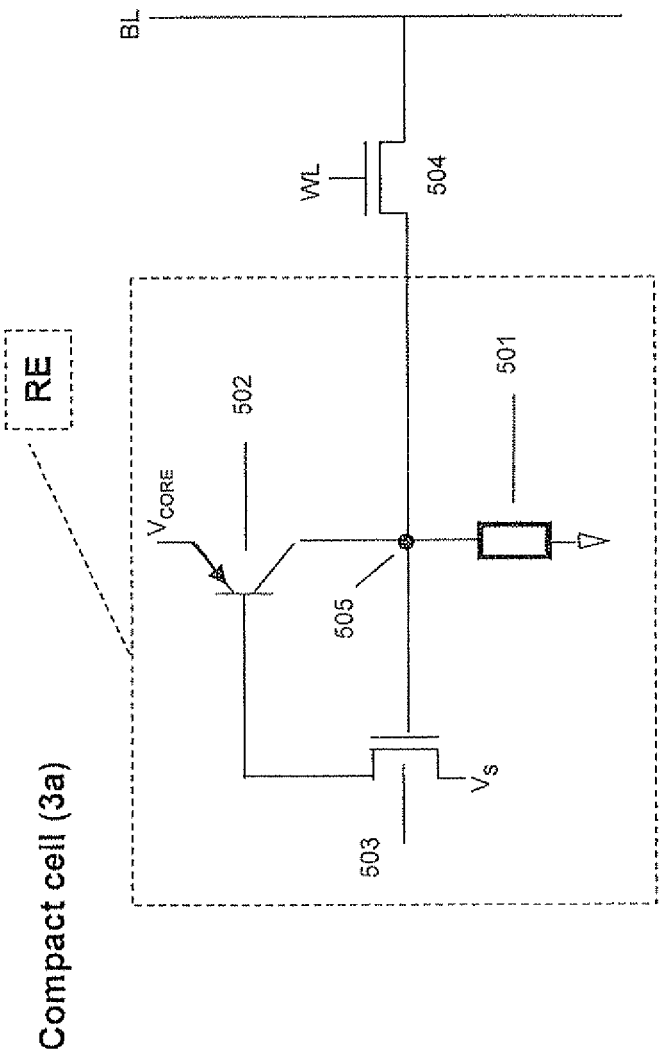
FIG. 5 is a schematic of a memory cell that is a "mirror image" of the memory cell of FIG. 4-FIG. 4A, in accordance with one embodiment of the present invention.

FIG. 5 shows a schematic of a three-transistor BJT retention element called memory cell 3A, which may use equivalent designs to the structure of the memory cell 3 of FIG. 4 and FIG. 4A but with the opposite pull up and pull down implementation. In memory cell 3A of FIG. 5, the high impedance 401 may be replaced by the high impedance 501 that pulls down. Again, transistor 504 can be PMOS instead of NMOS. When the system writes "1" into compact memory cell 3A shown in FIG. 5, the input node 505 may obtain $V_{core}$ level that may turn ON NMOS transistor 503 because $V_{core}$>Vs. This state may be retained until the system writes "0", at which point pulling down node 505 will cut off NMOS transistor 503 thereby also cutting off NPN transistor 502, and the memory cell may hold "0". The input node 505 (and node 405 in FIG. 4A) may have a high resistance path towards the power supply thus giving these cells good noise immunity.

The process in FIG. 2 and FIG. 4 may be used for any application utilizing CMOS integration with low gain BJT and not only for memory applications.

The following technical details illustrate one non-limiting possible realization of the retention elements depicted in FIGS. 1-5. The following process parameters may be applied in accordance with process simulations (for example in the following order):

Grounded N-well (same doping and depth of equivalent ordinary CMOS process).

First compensated P-type implant layer: doping of 2-8e17/cm$^3$, depth of 200 nm.

Second compensated N-type implant layer: doping 2-6e17/cm$^3$, depth of 160 nm.

Standard gate formation.

Standard drain and source formation (simultaneously forming the base and emitter of the bipolar devices).

Operation Parameters of a Single Compact Cell (2) at 65 nm:

Cell estimated lay out area: 0.25 u$^2$

Cell internal node capacitance: 0.5 fF

Cell operating power: 0.6V

Read out operating power: 0.9V

While the invention has been described with respect to a limited number of embodiments, it will be appreciated that many variations, modifications and other applications of the invention may be made. Therefore, the claimed invention as recited in the claims that follow is not limited to the embodiments described herein.

What is claimed is:

1. A volatile memory cell comprising:
   a retention element implemented as two cross-coupled pairs of transistors, at least one of the transistors is a bipolar junction transistor (BJT) and at least one of the transistors is not a BJT, wherein said at least one BJT comprises an emitter, base and collector, wherein at least two of the emitter, base and collector at said at least one BJT are implemented by overlapping portions of multiple vertically stacked layers on top of a standard CMOS integrated circuit, such that a same layer of the multiple vertically stacked layers implements a different one of the emitter, base and collector for at least two different transistors; and
   an access element in operative association with the retention element and further implemented as an at least one CMOS transistor.

2. The volatile memory cell according to claim 1, wherein each one of the BJTs occupies an area smaller than an area occupied by a single smallest NMOS of a fabrication process of the volatile memory cell.

3. The volatile memory cell according to claim 1, wherein each of the pairs comprise at least one BJT, and wherein two emitters or two bases or two collectors of corresponding two BJTs, one of each pair, share the same layer.

4. The volatile memory cell according to claim 1, wherein a current gain on each of the BJTs is in the order of magnitude of 1.

5. The volatile memory cell according to claim 1, wherein at least one of the transistors is a CMOS transistor and the rest of the transistors are BJTs.

6. The volatile memory cell according to claim 1, wherein at least one of the BJTs comprise a dummy gate that isolates between two terminals of the BJT.

7. The volatile memory cell according to claim 1, wherein at least one of the transistors is a NPN BJT transistor, wherein the base terminal of at least one of the NPN transistors comprises a shallow trench isolation (STI) and an additional P well layer that is shallower than the STI.

8. The volatile memory cell according to claim 1, wherein at least one of the transistors is a PNP BJT transistor, wherein the base terminal of at least one of the PNP transistors comprises a shallow trench isolation (STI) and an additional N well layer that is shallower than the STI.

9. A random access memory (RAM) integrated circuit (IC), comprising:
an array of memory cells, each memory cell comprising a retention element and a CMOS transistor, the a retention element implemented as two cross-coupled pairs of transistors, at least one of the transistors is a bipolar junction transistor (BJT) and at least one of the transistors is not a BJT, wherein said at least one BJT comprises an emitter, base and collector, wherein at least two of the emitter, base and collector at said at least one BJT are implemented by overlapping portions of multiple vertically stacked layers on top of a standard CMOS integrated circuit, such that a same layer of the multiple vertically stacked layers implements a different one of the emitter, base and collector for at least two different transistors.

10. The RAM of claim 9, wherein at least one of the transistors is a NPN BJT transistor, wherein the base terminal of at least one of the NPN transistors comprises a shallow trench isolation (STI) and an additional P well layer that is shallower than the STI.

11. The RAM of claim 9, wherein at least one of the transistors is a PNP BJT transistor, wherein the base terminal of at least one of the PNP transistors comprises a shallow trench isolation (STI) and an additional N well layer that is shallower than the STI.

12. The RAM of claim 9, wherein the retention element is implemented by silicon on insulator (SOI) process.

13. The RAM of claim 9, wherein at least one of the transistors is a CMOS transistor and the rest of the transistors are BJTs.

14. The RAM of claim 9, wherein at least one of the BJTs comprise a dummy gate that isolates between two terminals of the BJT.

15. The RAM of claim 9, wherein each one of the BJTs occupies an area smaller than an area occupied by a single smallest NMOS of a fabrication process of the volatile memory cell.

16. The RAM of claim 9, wherein each of the pairs comprise at least one BJT, and wherein two emitters or two bases or two collectors of corresponding two BJTs, one of each pair, share the same layer.

17. The RAM of claim 9, wherein a current gain on each of the BJTs is in the order of magnitude of 1.

* * * * *